US006643210B2

(12) United States Patent
Yamano

(10) Patent No.: US 6,643,210 B2
(45) Date of Patent: Nov. 4, 2003

(54) SEMICONDUCTOR INTEGRATED CIRCUIT DEVICE AND METHOD OF CONTROLLING THE SAME

(75) Inventor: Kaname Yamano, Ibaraki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/076,092

(22) Filed: Feb. 15, 2002

(65) Prior Publication Data
US 2002/0114208 A1 Aug. 22, 2002

(30) Foreign Application Priority Data
Feb. 16, 2001 (JP) ........................................ 2001-040029

(51) Int. Cl.$^7$ ................................................ G11C 7/00
(52) U.S. Cl. ............................ 365/230.03; 365/185.24
(58) Field of Search ...................... 365/230.03, 185.24

(56) References Cited

U.S. PATENT DOCUMENTS 6,144,583 A  * 11/2000  Shiba .................... 365/185.13
6,272,049 B1 *  8/2001  Maruyama et al. .... 365/185.24

FOREIGN PATENT DOCUMENTS

JP          9-153559          6/1997

* cited by examiner

Primary Examiner—M. Tran
(74) Attorney, Agent, or Firm—Morrison & Foerster LLP

(57) ABSTRACT

Sub bit lines are connected to associated main bit lines, which are common to a plurality of memory blocks, through respective first MOS field effect transistors. The main bit lines are grounded through respective second MOS field effect transistors. When the first and second MOS field effect transistors are turned on, charges accumulated in drain regions of nonvolatile memory cells are extracted via the first MOS field effect transistors, the main bit lines and the second MOS field effect transistors.

8 Claims, 7 Drawing Sheets

SEMICONDUCTOR INTEGRATED CIRCUIT DEVICE AND METHOD OF CONTROLLING THE SAME

BACKGROUND OF THE INVENTION

The present invention relates to a semiconductor integrated circuit device and the method of controlling the same.

An EEPROM (electrically erasable programmable read-only memory), one of different kinds of nonvolatile memories, has a plurality of memory cells. A known memory Ad cell consists of a floating gate field effect transistor (FET) with a double-layer electrode structure composed of a source region, a drain region, a channel region, a floating gate electrode provided on the channel region via an insulating film, and a control gate electrode provided on the floating gate electrode via an insulating film. A control signal is sent to the control gate electrode via a word line. As a structure of the word line, a structure constituted by a main word line and a sub word line connected to the main word line via a switching element is known. Such a structure is employed in a conventional flash memory, in which a large amount of currents flow into memory cells during a read or write operation. This is because, when a structure composed of a bit line and a sub bit line is employed in the flash memory, a voltage across the switching element for connecting the main bit line and the sub bit line falls markedly and this may result in misreading of the memory cells or an increased load on a circuit for generating a write voltage.

The flash memory has a plurality of memory blocks with memory cells arranged in a matrix therein. Each of the memory blocks is provided with a bit line decoder and bit lines, independently of the other memory blocks. Information is read from the flash memory having such a configuration as follows.

First, a switching element connecting a main word line and a sub word line is turned on to select the main word line and the sub word line, and then a voltage required for a read operation is applied to the sub word line through the main word line. Subsequently, a predetermined voltage is applied to a selected bit line to select a memory cell. Then, a current flowing through the selected memory cell is compared with a predetermined reference value by a differential amplifier, and a result determined based on the comparison is output as data.

At this time, when a charge remains in drains of unselected memory cells commonly connected to the sub word line, that is, memory cells for which the associated word line is selected and of which the sources have a low potential, the charge accumulated in the drain is pulled out, or extracted to the source side. In the flash memory, since memory cells in the same memory block usually have their sources commonly connected, currents to the sources in these unselected memory cells raise a source potential and may result in misreading.

Furthermore, since the charge in the drain is pulled to the source side in the unselected memory cells, hot electrons, that is, high-energy electrons are generated, and the electrons are injected into the floating gate electrodes of the unselected memory cells. Therefore, the threshold value of the unselected memory cells may rise.

Therefore, in general, the bit lines connected to the drains of the memory cells are connected to a discharge circuit via a switching element so that the charge in the drains of the memory cells is extracted via the bit lines when the flash memory is in a standby state, that is, a non-access state.

Meanwhile, in the conventional flash memory, when electrons are extracted from a floating gate electrode of a memory cell (an erase operation is assumed here), a method of applying a negative voltage to a word line is employed in general. In this case, the following problems occur in a flash memory having main word lines and sub word lines, the latter being provided in each memory block independently of the other memory blocks.

The switching element connecting the main word line and the sub word line needs to transmit a positive voltage during read and write operations and a negative voltage during an erase operation. Therefore, voltage control of the switching element becomes complicated and a control circuit provided to apply the positive voltage and the negative voltage to the switching element disadvantageously enlarges the memory.

An example of a semiconductor integrated circuit device having main word lines and sub word lines like the above-described flash memory is shown in FIG. 5. The semiconductor integrated circuit device has a memory cell region M made up of a plurality of memory blocks $MB_0, \ldots, MB_X$ and main word lines $WLM_0, \ldots, WLM_n$ commonly connected to the plurality of memory block $MB_0, \ldots, MB_X$. Each memory block $MB_0, \ldots, MB_X$ has a plurality of memory cells $MC_{00}, \ldots, MC_{nm}$ arranged in a matrix. Each memory cell $MC_{00}, \ldots, MC_{nm}$, consists of a floating gate type field effect transistor having a control electrode and a floating electrode. Furthermore, in each of the memory blocks $MB_0, \ldots, MB_X$, drain regions of the memory cells in the same column are commonly connected by an associated bit line $BL_0, \ldots,$ or $BL_m$, while control gate electrodes of the memory cells in the same row are commonly connected by a sub word line $WLS_0, \ldots,$ or $WLS_n$. Furthermore, P-type MOS (Metal Oxide Semiconductor) field effect transistors $LWS_{00}, \ldots, LWS_{Xn}$ for selecting sub word lines $WLS_0, \ldots, WLS_n$ are provided in each of the memory blocks $MB_0, \ldots, MB_X$. The P-type MOS field effect transistors $LWS_{00}, \ldots, LWS_{Xn}$ of each memory block are connected to a sub word line selecting circuit 100 via an associated memory block selecting gate line $BS_0, \ldots,$ or $BS_X$ and to a voltage switching circuit 200 for switching between a back bias high voltage and a voltage VSS via an associated back bias supply line $NW_0, \ldots,$ or $NW_X$. Furthermore, to pull out a charge accumulated in the bit line $BL_0, \ldots, BL_m$, the bit line $BL_0, \ldots, BL_m$ is grounded via a MOS field effect transistor $DC_0, \ldots, DC_m$. The MOS field effect transistor $DC_0, \ldots, DC_m$ is controlled by a discharge selecting gate line $DDC_0, \ldots, DDC_m$. Furthermore, the main word line $WLM_0, \ldots, WLM_n$ and the sub word line $WLS_0, \ldots, WLS_n$ are connected via the P-type MOS field effect transistor $LWS_{00}, \ldots, LWS_{Xn}$. A voltage is supplied from a main word line decoder MWD to the main word line $WLM_0, \ldots, WLM_n$. Furthermore, in the sub word line selecting circuit 100 from which a voltage is supplied to a P-type MOS field effect transistor $LWS_{00}, \ldots, LWS_{Xn}$, control for generating a negative voltage required depending on the operation is performed. As is obvious, since the field effect transistors $DC_0, \ldots, DC_m$, the sub word line selecting circuit 100 and the voltage switching circuit 200 are required in each memory block $MB_0, \ldots, MB_X$, the circuit size becomes large.

Hereafter, voltage control during a read operation in the semiconductor integrated circuit device will be explained below with reference to FIG. 6. In FIG. 6, it is assumed that a memory cell $MC_{00}$ in the memory block $MB_0$ is selected.

In a read operation, as shown in FIG. 6, a voltage of about 5 V is applied to the control gate electrode of the memory cell $MC_{00}$, while a voltage of about 1 V is applied to the drain region of the memory cell $MC_{00}$. At this time, a voltage to be applied to the control gate electrodes of unselected memory cells $MC_{10}, \ldots, MC_{1m}; \ldots; MC_{n0}, \ldots, MC_{nm}$ in the memory block $MB_0$ needs to be set at 0 V. Therefore, a voltage of −5 V is applied to the memory block selecting gate line $BS_0$, and the main word lines $WLM_1$–$WLM_n$ at 0 V are electrically connected to the associated sub word line $WLS_1$–$WLS_n$.

Voltage control during a write operation in the semiconductor integrated circuit device is explained below with reference to FIG. 7. In FIG. 7, it is assumed that a memory cell $MC_{00}$ in the memory block $MB_0$ is selected.

During a write operation, as shown in FIG. 7, a voltage of about 10 V is applied to the control gate electrode of the memory cell $MC_{00}$, while a voltage of 4 to 5 V is applied to the drain region of the memory cell $MC_{00}$. At this time, a voltage to be applied to the control gate electrodes of unselected memory cells $MC_{10}, \ldots, MC_{1m}; \ldots; MC_{n0}, \ldots, MC_{nm}$ in the memory block $MB_0$ needs to be set at 0 V. Therefore, a voltage of the memory block selecting gate line $BS_0$ must be a negative voltage. Furthermore, a voltage of 10 V must not be applied to the sub word lines $WLS_0, \ldots, WLS_n$ in the unselected memory blocks $MB_1, \ldots, MB_X$ so that write reliability is ensured. That is, the voltage of the control gate electrodes of the memory cells $MC_{00}, \ldots, MC_{nm}$ in the unselected memory blocks $MB_1, \ldots, MB_X$ needs to be 0 V. Therefore, a voltage of about 10 V is applied to the gate electrodes of the P-type MOS field effect transistors $LWS_{10}$–$LWS_{xn}$ in the unselected memory blocks $MB_1, \ldots, MB_X$. Meanwhile, when a voltage of about −5 V similar to that of the read operation is applied to the gate electrode of the P-type MOS field effect transistor $LWS_{00}, \ldots, LWS_{0n}$ in the selected memory block $MB_0$, a voltage across the source and gate electrode of the P-type MOS field effect transistor $LWS_{00}$ exceeds the withstand or breakdown voltage, and the P-type MOS field effect transistor $LWS_{00}$ may be damaged. Therefore, during the write operation, the gate voltage of the P-type MOS field effect transistor $LWS_{00}, \ldots, LWS_{0n}$ in the selected memory block $MB_0$ is generally set at a voltage smaller than that of the read operation, for example, −2 V.

As described above, in the case of a semiconductor integrated circuit device having main word lines $WLM_0, \ldots, WLM_n$ and sub word lines $WLS_0, \ldots, WLS_n$, voltage control of gate electrodes of switching elements $LWS_{00}, \ldots, LWS_{Xn}$ or the like is essential during each of read and write operations. Therefore, a back bias control circuit of switching elements $LWS_{00}, \ldots, LWS_{Xn}$ selecting the sub word lines $WLS_0, \ldots, WLS_n$ and a circuit for controlling gate voltages of switching elements $LWS_{00}, \ldots, LWS_{Xn}$ are required. As a result, the control circuit becomes complicated and the peripheral circuit is enlarged, which may result in a larger chip size.

Meanwhile, with recent development in fine processing technology, a lower operating current for a memory cell has been achieved. Consequently, memory array configuration having main bit lines and sub bit lines has become employable in a semiconductor integrated circuit device. Since each memory block has word lines independently of the other memory blocks in the semiconductor integrated circuit device having main bit lines and sub bit lines, the switching elements requiring complicated voltage control become unnecessary. Furthermore, since the wiring capacitance of the word line is decreased, time required for reading or writing data from/to the memory cell can be shortened.

However, even in the semiconductor integrated circuit device having main bit lines and sub bit lines, a switching element for extracting a charge accumulated in the drain region of the memory cell at the time of standby (at the time of non-access) needs to be disposed in each memory block. As a result, a circuit for controlling the switching element is required in each memory block, and thus a problem arises that the circuit size is increased.

Examples of the semiconductor integrated circuit device having main bit lines and sub bit lines described above include the one disclosed in Japanese Patent Laid-Open Publication No. 9-153559. The semiconductor integrated circuit device described in this Japanese Patent Laid-Open Publication is provided with elements for pulling a charge accumulated in the drain regions of memory cells without passing through the memory cells and has a path for eliminating the charge. However, according to the semiconductor integrated circuit device of the Japanese Patent Laid-Open Publication No. 9-153559, since the elements for pulling the charge and a circuit for controlling the elements are provided in each of a plurality of memory blocks, a problem arises that a circuit occupation area around the memory block is increased.

SUMMARY OF THE INVENTION

Accordingly, the object of the present invention is to provide a semiconductor integrated circuit device which is allowed to have a reduced circuit occupation area, and a method of controlling the same.

A semiconductor integrated circuit device according to the present invention includes a plurality of memory blocks. Each memory block includes:

a plurality of nonvolatile memory cells arranged in a matrix form, each nonvolatile memory cell having a gate region, a source region and a drain region;

word lines each of which is commonly connected to the gate regions of the nonvolatile memory cells in the same row;

a source line which is commonly connected to the source regions of the nonvolatile memory cells;

sub bit lines each of which is commonly connected to the drain regions of the nonvolatile memory cells in the same column; and first switching elements for selecting the associated sub bit lines, The plurality of memory blocks being arranged in a column direction, and the semiconductor integrated circuit device further includes:

main bit lines which are common to the plurality of memory blocks and to which the sub bit lines in each memory block are connected via the respective first switching elements; and at least one second switching element for extracting charges accumulated in drain regions of the nonvolatile memory cells via the first switching elements and the main bit lines.

According to the semiconductor integrated circuit device having the above configuration, when the first and second switching elements are turned on, charges accumulated in the drain regions of the nonvolatile memory cells are extracted or pulled out via the first switching elements and the main bit line. Since the charges in the drain regions of the nonvolatile memory cells are extracted therefrom via the first switching elements and the main bit lines, no switching elements for extracting the charges from the drain regions of the nonvolatile memory cells need to be provided on the sub bit lines. That is, no second switching elements for extracting the charges need to be provided in each memory block. Therefore, no circuits for controlling the second switching elements for extracting the charges need to be provided for each memory block, either. Thus the circuit occupation area of the semiconductor integrated circuit device of the present invention can be reduced.

Furthermore, because each of the main bit lines is commonly used by the plurality of memory blocks, control for extracting charges does not need to be performed in each memory block. Therefore, the control for extracting the charges from the drain regions of the nonvolatile memory cells is simplified.

Each memory cell may be constituted of a floating gate type field effect transistor.

In one embodiment, one second switching element is provided for one main bit line. Thus, a charge can be extracted every main bit line by controlling the second switching elements.

In one embodiment, the main bit lines are grounded via the at least one second switching element. Thus, the charge accumulated in the drain region of the nonvolatile memory cell can be allowed to escape to the ground.

The first switching elements in one memory block may be connected to a common signal line.

In one embodiment, each of the first switching elements is constituted of a MOS field effect transistor through which the sub bit lines are connected to the associated bit lines. Also, the gates of the MOS field effect transistors in one memory block are commonly connected to a memory block selecting gate line.

The present invention also provides a method of controlling the semiconductor integrated circuit device with the above arrangement. In the controlling method, upon completion of at least one of read, write and erase operations of selected nonvolatile memory cells in the memory blocks, the first switching elements and the at least one second switching element are turned on.

With this controlling method, occurrence of hot electrons can be prevented by extracting the charges in the drain regions of the nonvolatile memory cells via the first switching elements, the main bit lines and the at least one second switching element.

The present invention provides another method of controlling the semiconductor integrated circuit device with the above arrangement. In this controlling method, upon completion of each of read, write and erase operations of selected nonvolatile memory cells in the memory blocks, the first switching elements are turned on.

According to this controlling method, since the first switching elements are in an on state before and after the read, write and erase operations of the selected nonvolatile memory cells in the memory blocks, charges in the drain regions of the nonvolatile memory cells are extracted only by turning on the second switching element. Therefore, control for extracting the charges before and after the read, write and erase operations of the selected nonvolatile memory cells is simplified.

Furthermore, the present invention provides a still another method of controlling the semiconductor integrated circuit device with the above configuration. In the controlling method, the first switching elements and the at least one second switching element are turned on in a standby state of the device to thereby extract charges accumulated in the drain regions of the nonvolatile memory cells.

With this controlling method, occurrence of hot electrons after the device is released from the standby state can be prevented.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

An embodiment of the semiconductor integrated circuit device and a method of controlling the same according to the present invention will be described in detail below with reference to accompanying drawings.

Figure 1:
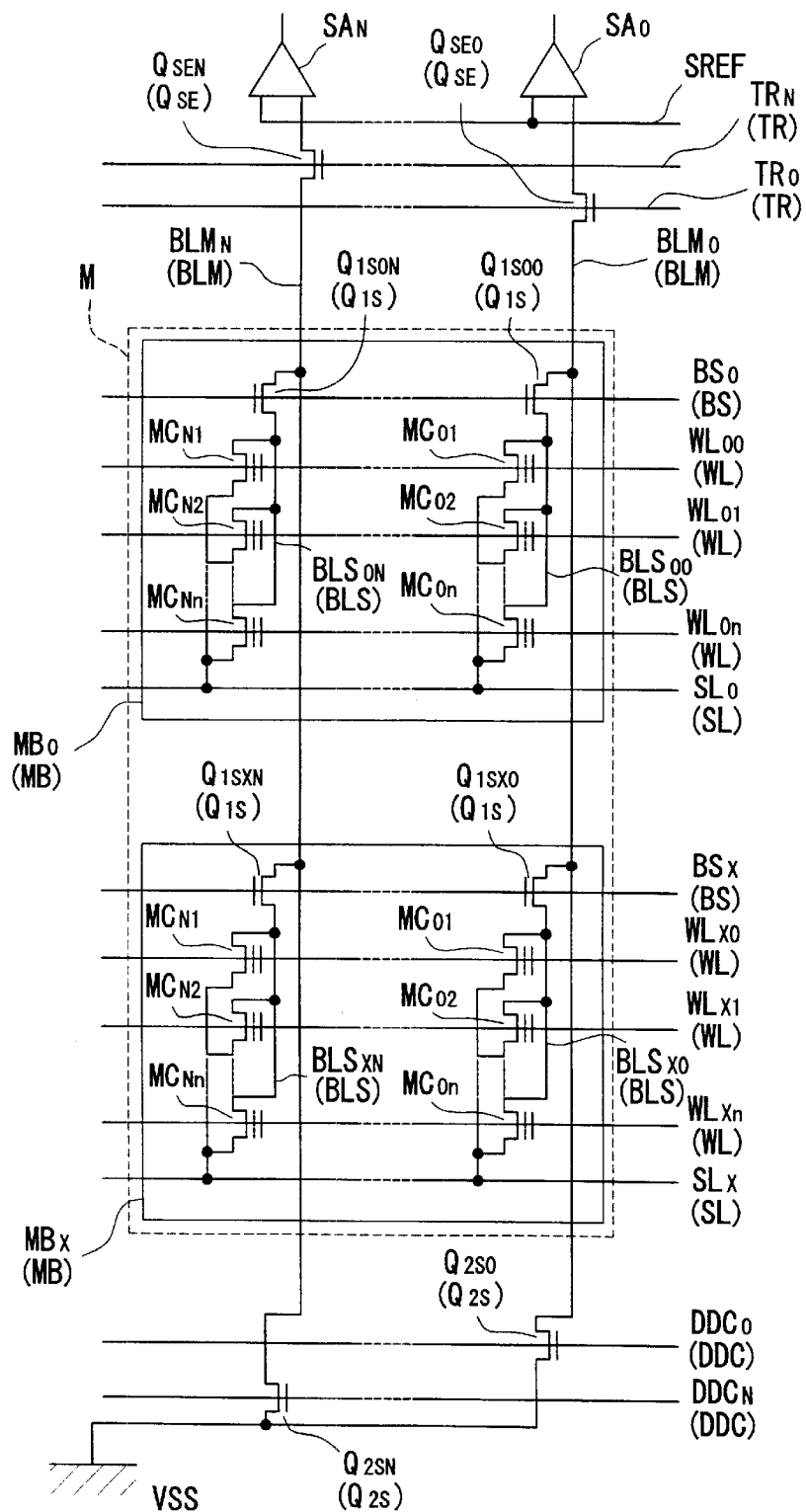
FIG. 1 is a circuit diagram showing a substantial portion of a semiconductor integrated circuit device according to one embodiment of the invention.

FIG. 1 is a circuit diagram showing a substantial portion of a semiconductor integrated circuit device according to one embodiment of the present invention.

As shown in FIG. 1, the semiconductor integrated circuit device has a memory cell region M constituted of a plurality of memory blocks $MB_0, \ldots, MB_X$. Although not shown, further memory cell regions M are arrayed in a horizontal direction, and word lines $WL_{00}, \ldots, WL_{Xn}$ are commonly used. In each of the memory blocks $MB_0, \ldots, MB_X$, a plurality of nonvolatile memory cells $MC_{00}, \ldots, MC_{Nn}$ are arranged in a matrix, namely in rows and columns. Each of the nonvolatile memory cells $MC_{00}, \ldots, MC_{Nn}$ is a floating gate type field effect transistor having a double-layer electrode structure composed of a source region, a drain region, a channel region, a floating gate electrode provided on the channel region via an insulating film and a control gate electrode provided on the floating gate electrode via an insulating film although not shown in the figure. Furthermore, each of the memory blocks $MB_0, \ldots, MB_X$ has word lines $WL_{00}, \ldots, WL_{Xn}$ to which gate regions of the nonvolatile memory cells $MC_{00} \ldots MC_{N0}; MC_{01} \ldots MC_{N1}; \ldots; MC_{0n} \ldots MC_{Nn}$ in the same row are commonly connected, source lines $SL_0, \ldots, SL_X$ to which source regions of the nonvolatile memory cells $MC_{00}, \ldots, MC_{Nn}$ are commonly connected, and sub bit lines $BLS_{00}, \ldots, BLS_{XN}$ to which drain regions of the nonvolatile memory cells $MC_{00} \ldots MC_{0n}; MC_{10} \ldots MC_{1n}; \ldots; MC_{N0} \ldots MC_{Nn}$ in the same column are commonly connected. Furthermore, the memory blocks $MB_0, \ldots, MB_X$ are provided with first MOS field effect transistors $Q_{1S00}, \ldots, Q_{1SXN}$ as first switching elements for selecting each sub bit line $BLS_{00}, \ldots, BLS_{XN}$. Furthermore, the nonvolatile memory cells $MC_{00}, \ldots, MC_{Nn}$ are connected in parallel between the sub bit lines $BLS_{00}, \ldots, BLS_{XN}$ and the source lines $SL_0, \ldots, SL_X$.

Furthermore, the semiconductor integrated circuit device has main bit lines $BLM_0, \ldots, BLM_N$ commonly connected to a plurality of memory blocks $MB_0, \ldots, MB_X$ for each column.

The sub bit lines $BLS_{00}, \ldots, BLS_{XN}$ in each memory block $MB_0, \ldots, MB_X$ are electrically connected to the main bit lines $BLM_0, \ldots, BLM_N$ via the respective first MOS field effect transistors $Q_{1S00}, \ldots, Q_{1SXN}$. Furthermore, second MOS field effect transistors $Q_{2S0}, \ldots, Q_{2SN}$ are provided as second switching elements for each of the main bit lines $BLM_0, \ldots, BLM_N$, and one end of each main bit line $BLM_0, \ldots, BLM_N$ is electrically connected to a ground potential VSS via the respective second MOS field effect transistors $Q_{2S0}, \ldots, Q_{2SN}$. Meanwhile, the other end of each main bit line $BLM_0, \ldots, BLM_N$ is electrically connected to a sense amplifier $SA_0, \ldots, SA_N$ via a third MOS field effect transistor $Q_{SE0}, \ldots, Q_{SEN}$. The second MOS field effect transistor $Q_{2S0}, \ldots, Q_{2SN}$ receives a signal from a discharge selecting gate line $DDC_0, \ldots, DDC_N$, and the third MOS field effect transistor $Q_{SE0}, \ldots, Q_{SEN}$ receives a signal from a main bit line selecting gate line $TR_0, \ldots, TR_N$. Reference symbol SREF in FIG. 1 denotes a signal line for transmitting a reference voltage level for comparison when a nonvolatile memory cell $MC_{00}, \ldots, MC_{Nn}$ in a memory block $MB_0, \ldots, MB_X$ is read. This signal line SREF is connected to each sense amplifier $SA_0, SA_1, \ldots, SA_N$. Furthermore, the first MOS field effect transistors $Q_{1S00}, \ldots, Q_{1SXN}$ are driven by the memory block selecting gate lines $BS_0, \ldots, BS_X$. The first MOS field effect transistors $Q_{1S00}, \ldots, Q_{1SXN}$ in each memory block $MB_0, \ldots, MB_X$ are commonly connected to the associated memory block selecting gate line $BS_0, \ldots, BS_X$.

In FIG. 1, the subscript 'X' corresponds to a block number. That is, the number of the memory blocks $MB_0, \ldots, MB_X$ is (X+1). The subscript 'n' for the word lines $WL_{00}, \ldots, WL_{Xn}$ and 'N' for the main bit line $BLM_0, \ldots, BLM_N$ correspond to the numbers of those lines, respectively. That is, the number of the word lines $WL_{00}, \ldots, WL_{Xn}$ is (n+1) in each memory block $MB_0, \ldots, MB_X$ and (X+1)·(n+1) in the whole circuit, while the number of the main bit lines $BLM_0, \ldots, BLM_N$ is (N+1) in the whole circuit. Furthermore, the number of the nonvolatile memory cells $MC_{00}, \ldots, MC_{Nn}$ corresponds to the numbers of the word lines $WL_{00}, \ldots, WL_{Xn}$ and the main bit lines $BLM_0, \ldots, BLM_N$. Consequently, the number of the nonvolatile memory cells $MC_{00}, \ldots, MC_{Nn}$ is (N+1)·(n+1) in each memory block $MB_0, \ldots, MB_X$ and (X+1)·(N+1)·(n+1) in the whole circuit. It is noted that X, N and n are natural numbers. Furthermore, the number of the first MOS field effect transistors $Q_{1S00}, \ldots, Q_{1SXN}$ connected to one main bit line $BLM_0, \ldots, BLM_N$ is (X+1).

According to the semiconductor integrated circuit device having the above configuration, when the first MOS field effect transistor $Q_{1S00}, \ldots, Q_{1SXN}$ is turned on while the second MOS field effect transistor $Q_{2S0}, \ldots, Q_{2SN}$ is turned on, a charge accumulated in a region between the nonvolatile memory cell $MC_{00}, \ldots, MC_{Nn}$ and the first MOS field effect transistor $Q_{1S00}, \ldots, Q_{1SXN}$, that is, the drain region of the nonvolatile memory cell $MC_{00}, \ldots, MC_{Nn}$ is extracted via the first MOS field effect transistor $Q_{1S00}, \ldots, Q_{1SXN}$ and the main bit line $BLM_0, \ldots, BLM_N$. Since the charge is extracted from the drain region of the nonvolatile memory cell $MC_{00}, \ldots, MC_{Nn}$ via the first MOS field effect transistor $Q_{1S00}, \ldots, Q_{1SXN}$ and the main bit line $BLM_0, \ldots, BLM_N$, no specialized switching elements for extracting a charge in the drain regions of the nonvolatile memory cells $MC_{00}, \ldots, MC_{Nn}$ are provided on the sub bit lines $BLS_{00}, \ldots, BLS_{XN}$ in each memory block. Accordingly, a circuit for controlling such specialized switching elements for extracting a charge is not provided for each memory block $MB_0, \ldots, MB_X$, either. Thus, the circuit occupation area is smaller than the conventional circuit occupation area.

Furthermore, since the main bit line $BLM_0, \ldots, BLM_N$ is shared or commonly used by the plurality of memory blocks $MB_0, \ldots, MB_X$, control for extracting the charge does not need to be performed in each memory block $MB_0, \ldots, MB_X$. Therefore, the control for extracting the charge from the drain regions of the nonvolatile memory cells $MC_{00}, \ldots, MC_{Nn}$ is simplified.

Furthermore, since the second MOS field effect transistor $Q_{2S0}, \ldots, Q_{2SN}$ is provided on each main bit line $BLM_0, \ldots, BLM_N$, a charge can be extracted from each main bit line $BLM_0, \ldots, BLM_N$ by controlling the second MOS field effect transistor $Q_{2S0}, \ldots, Q_{2SN}$.

Furthermore, since the main bit line $BLM_0, \ldots, BLM_N$ is grounded via the second MOS field effect transistor $Q_{2S0}, \ldots, Q_{2SN}$, a charge accumulated in the drain region of the nonvolatile memory cell $MC_{00}, \ldots, MC_{Nn}$ can be allowed to escape to the ground.

Figure 2:
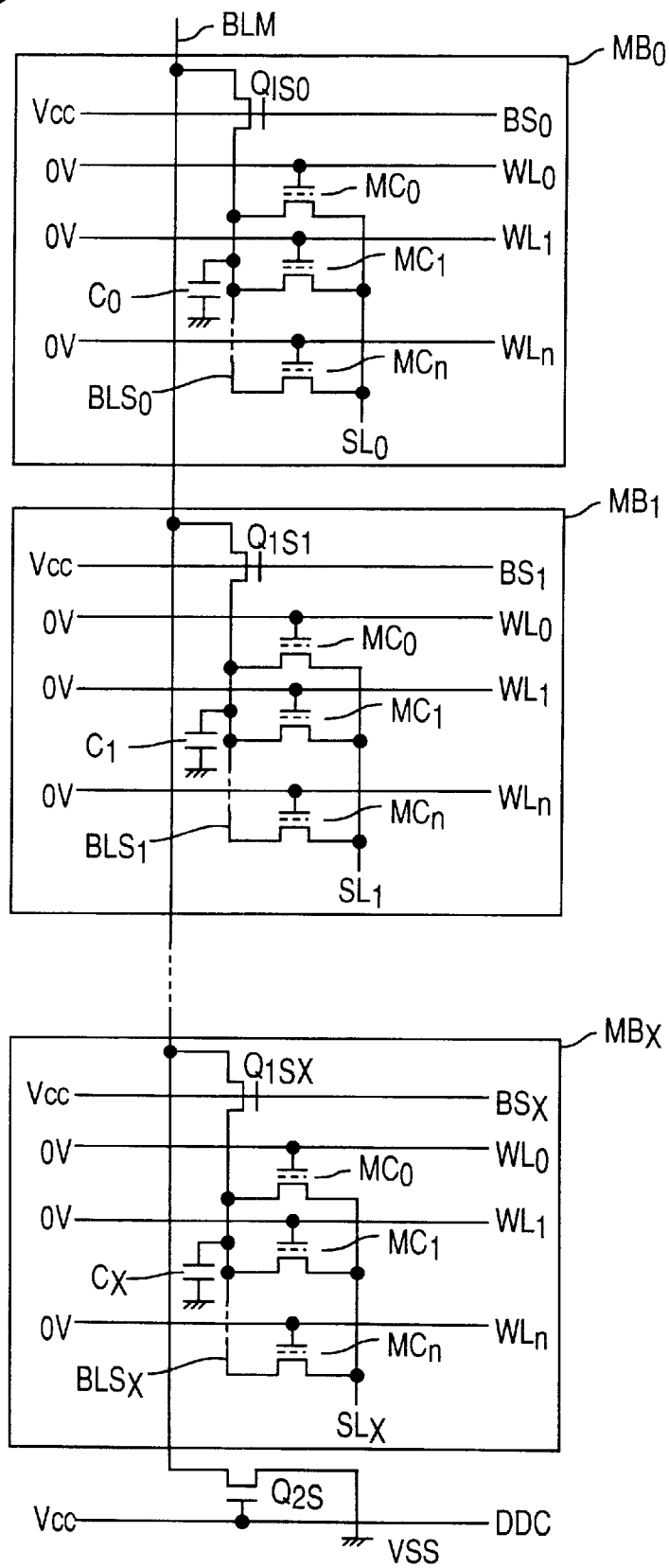
FIG. 2 is a circuit diagram for explaining a standby state of the semiconductor integrated circuit device.
Figure 3:
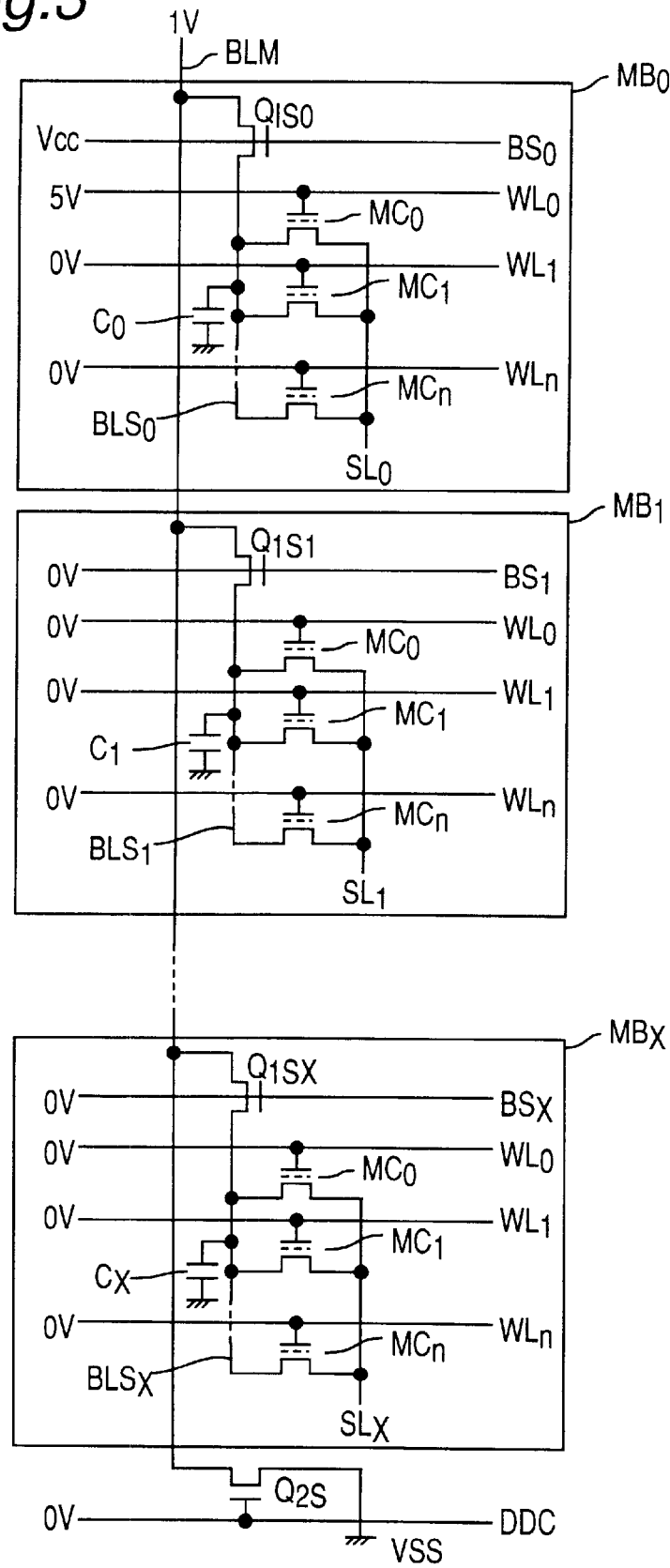
FIG. 3 is a circuit diagram for explaining a read operation of the semiconductor integrated circuit device.
Figure 4:
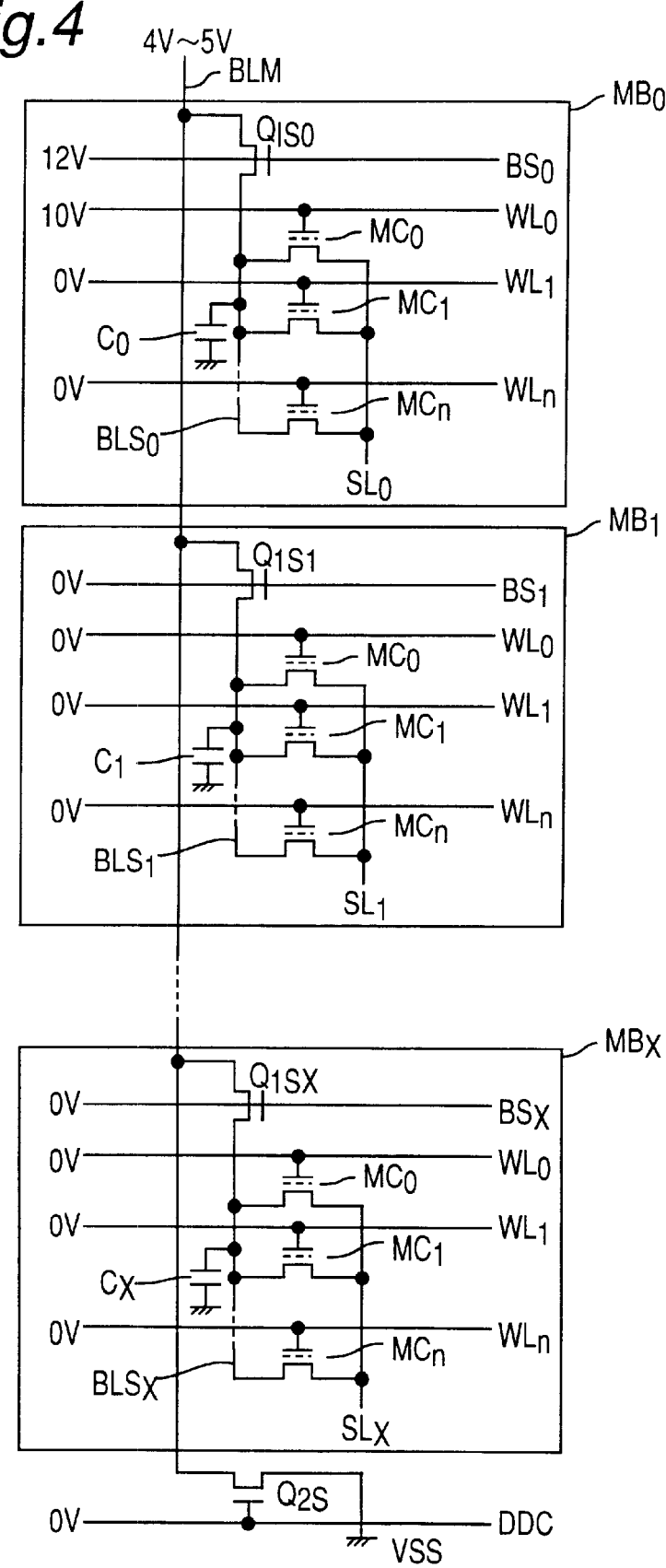
FIG. 4 is a circuit diagram for explaining a write operation of the semiconductor integrated circuit device.
Figure 5:
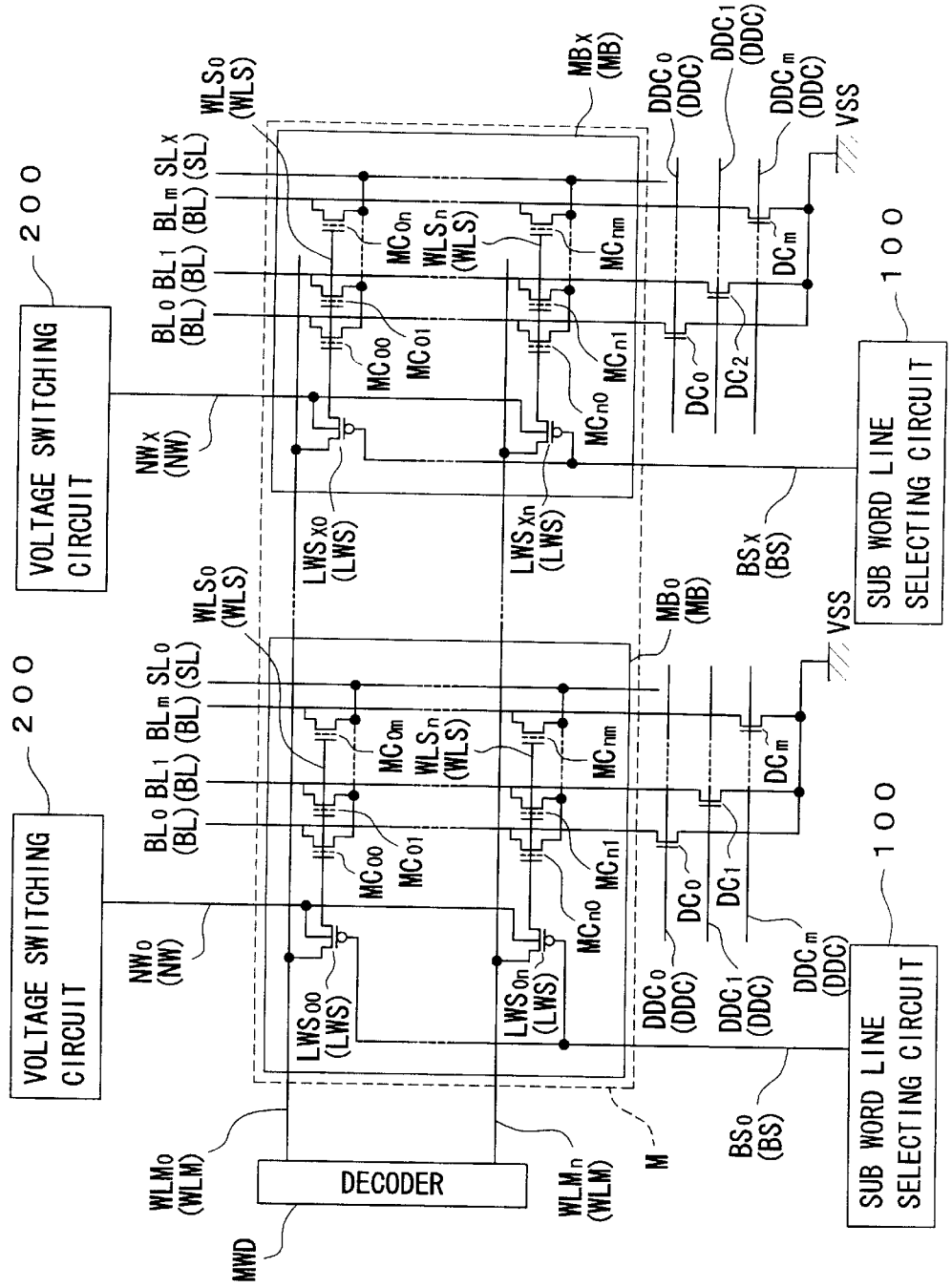
FIG. 5 is a circuit diagram showing a substantial portion of the conventional semiconductor integrated circuit.
Figure 6:
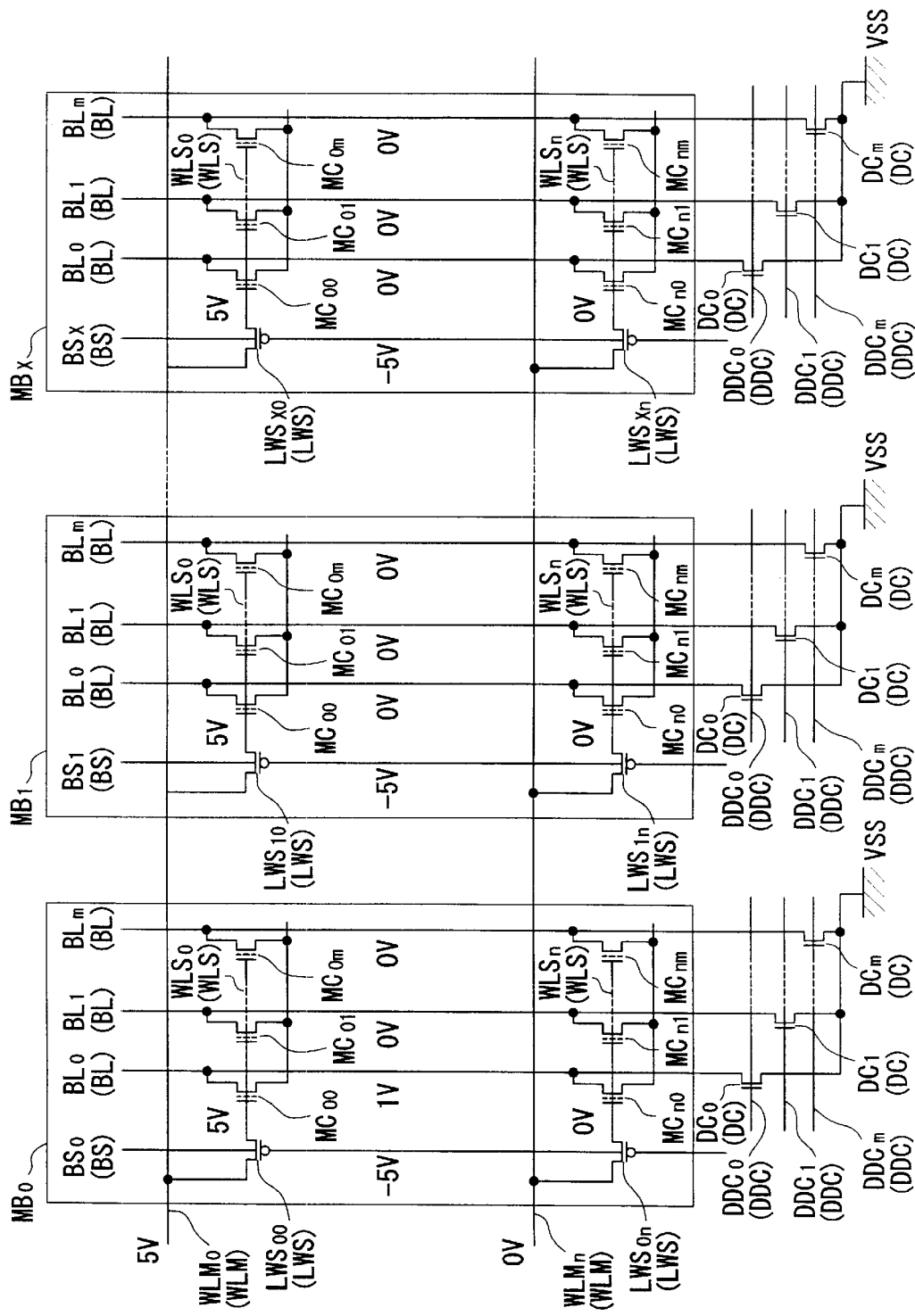
FIG. 6 is a circuit diagram for explaining a read operation of the conventional semiconductor integrated circuit device.
Figure 7:
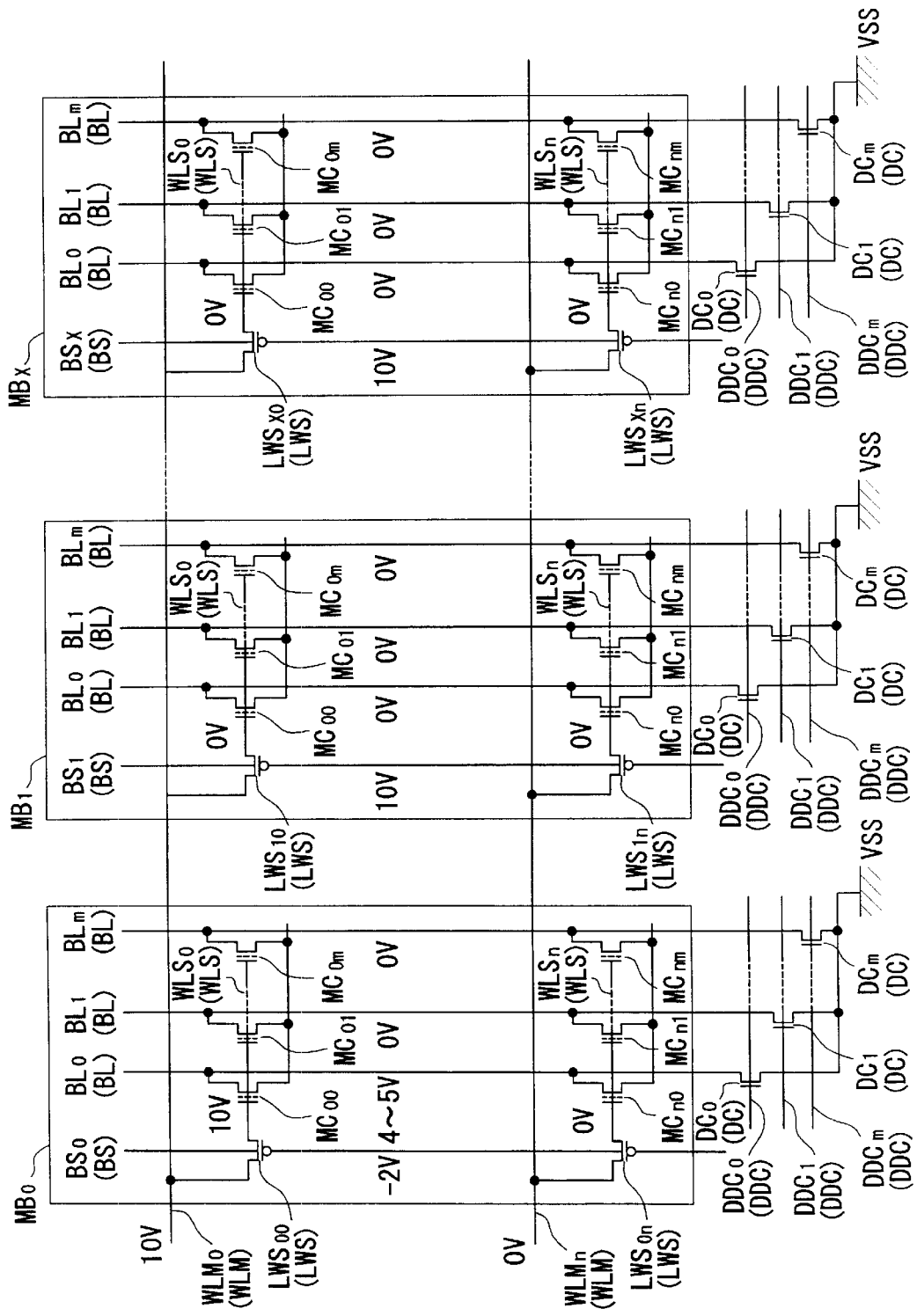
FIG. 7 is a circuit diagram for explaining a write operation of the conventional semiconductor integrated circuit device.

A read operation and a write operation of the semiconductor integrated circuit device will be explained below with reference to FIGS. 2, 3 and 4. In FIGS. 2, 3 and 4, only one of the main bit lines $BLM_0, \ldots, BLM_N$ is representatively shown. Therefore, the subscripts 0–N for the main bit lines are omitted from the reference numerals in FIGS. 2, 3 and 4.

First, the read operation of the semiconductor integrated circuit device will be explained.

Before the read operation is started, a voltage Vcc is applied to the memory block selecting gate lines $BS_0, \ldots, BS_X$, as shown in FIG. 2, to turn on all the first MOS field effect transistors $Q_{1S0}, \ldots, Q_{1SX}$. Then, a voltage Vcc is applied to the discharge selecting gate line DDC to turn on the second MOS field effect transistor $Q_{2S}$. A charge accumulated in the main bit line BLM and a parasitic capacitor $C_0, \ldots, C_X$ connected to the sub bit line $BLS_0, \ldots, BLS_X$ in each memory block $MB_0, \ldots, MB_X$ is discharged to a ground potential VSS.

Subsequently, when the read operation is performed, the sub bit line selecting signals $BS_1, \ldots, BS_X$ are set at 0 V in unselected memory blocks $MB_1, \ldots, MB_X$ to turn off their first MOS field effect transistors $Q_{1S1}, \ldots, Q_{1SX}$. Then, the discharge selecting gate line DCC is set at 0 V to turn off the second MOS field effect transistor $Q_{2S}$. On the other hand, in the selected memory block $MB_0$, a voltage of, for example, about 5 V is applied to a selected word line $WL_0$, while the other unselected word lines $WL_1, \ldots, WL_n$ are set at 0 V. At this time, a voltage of, for example, about 1 V is applied to the main bit line BLM, while the voltage of the source line SL is set at 0 V.

Then, after the read operation has been finished, the memory block selecting gate lines $BS_0, \ldots, BS_X$ are set at Vcc again as shown in FIG. 2 to turn on the first MOS field effect transistors $Q_{1S0}, \ldots, Q_{1SX}$ in the memory blocks $MB_0, \ldots, MB_X$. Then, the discharge selecting gate line DDC is set at Vcc to turn on the second MOS field effect transistor $Q_{2S}$. Consequently, a charge accumulated in the main bit line BLM and the sub bit line $BLS_0, \ldots, BLS_X$ is discharged to the ground potential VSS via the first MOS field effect transistor $Q_{1S0}, \ldots, Q_{1SX}$, the main bit line BLM and the second MOS field effect transistor $Q_{2S}$.

The write operation of the semiconductor integrated circuit device will be explained below.

Before the write operation is started, the memory block selecting gate lines $BS_0, \ldots, BS_X$ are set at a high voltage, that is, Vcc, as shown in FIG. 2, to turn on all the first MOS field effect transistors $Q_{1S0}, \ldots, Q_{1SX}$, while the discharge selecting gate line DDC is set at Vcc to turn on the second MOS field effect transistor $Q_{2S}$. Consequently, a charge accumulated in the main bit line BLM and a parasitic capacitor $C_0, \ldots, C_X$ connected to the sub bit line $BLS_0, \ldots, BLS_X$ in each memory block $MB_0, \ldots, MB_X$ is discharged to the ground potential VSS.

Subsequently, when the write operation is performed, memory block selecting gate lines $BS_1, \ldots, BS_X$ of unselected memory blocks $MB_1, \ldots, MB_X$ are set at 0 V, as shown in FIG. 4, to turn off their first MOS field effect transistors $Q_{1S1}, \ldots, Q_{1SX}$. Furthermore, the discharge selecting gate line DDC is set at 0 V to turn off the second MOS field effect transistor $Q_{2S}$. Then, a high voltage of about 12 V is applied to the first MOS field effect transistor $Q_{1S0}$ of the selected memory block $MB_0$. Consequently, a voltage of about 4 to 5 V is transmitted from the selected main bit line BLM to the drain region of the memory cell $MC_0, \ldots, MC_n$ in the memory block $MB_0$. At this time, for example, a voltage of about 10 V is applied to a selected word line $WL_0$, while the other unselected word lines $WL_1, \ldots, WL_X$ are set at 0 V. Furthermore, the source line $SL_0$ of the memory block $MB_0$ is set at 0 V.

After the write operation has been finished, the memory block selecting gate lines $BS_0, \ldots, BS_X$ are set at a high voltage, that is, Vcc again, as shown in FIG. 2, to turn on the first MOS field effect transistors $Q_{1S0}, \ldots, Q_{1SX}$ in each memory block $MB_0, \ldots, MB_X$. At this time, the discharge selecting gate line DDC is set at Vcc to turn on the second MOS field effect transistor $Q_{2S}$. Consequently, a charge accumulated in the main bit line BLM and the sub bit line $BLS_0, \ldots, BLS_X$ is discharged to the ground potential VSS via the first MOS field effect transistor $Q_{1S0}, \ldots, Q_{1SX}$, the main bit line BLM and the second MOS field effect transistor $Q_{2S}$.

Because the charges are thus extracted from the drain regions of the nonvolatile memory cells $MC_0, \ldots MC_n$ before and after the read and write operations of the selected nonvolatile memory cell $MC_0$ in the memory block $MB_0$, occurrence of hot electrons is prevented.

In the above embodiment, the second MOS field effect transistors $Q_{2S0}, \ldots, Q_{2SN}$ as the second switching elements are provided for the respective main bit lines $BLM_0, \ldots, BLM_N$. However, a plurality of main bit lines $BLM_0, \ldots, BLM_N$ may be connected to one common line and the second MOS field effect transistor $Q_{2S}$ may be provided on this common line. In this case, a plurality of main bit lines $BLM_0, \ldots, BLM_N$ are controlled by one second MOS field effect transistor $Q_{2S}$.

Furthermore, the sub bit lines $BLS_{00}, \ldots, BLS_{XN}$ are not grounded in the above embodiment, but may be grounded via a switching element. That is, the switching element for extracting a charge in the drain region of the nonvolatile memory cell $MC_{00}, \ldots, MC_{Nn}$ may be provided on the main bit line $BLM_0, \ldots, BLM_N$.

Furthermore, before and after the read and write operations of the selected nonvolatile memory cell $MC_0$ in the memory block $MB_0$, the first MOS field effect transistor $Q_{1S0}, \ldots, Q_{1SX}$ may be turned on. In this case, a charge in the drain region of the nonvolatile memory cell $MC_0, \ldots MC_n$ can be extracted only by turning on the second MOS field effect transistor $Q_{2S}$ before and after the read and write operations of the nonvolatile memory cell $MC_0$, control for extracting the charge is further simplified.

Furthermore, in the above embodiment, charges in the drain regions of the nonvolatile memory cells $MC_0, \ldots, MC_n$ are extracted before and after the read and write operations of the selected nonvolatile memory cell $MC_0$ in the memory block $MB_0$. However, the charges in the drain regions of the nonvolatile memory cells $MC_0, \ldots, MC_n$ may be extracted before and after an erase operation.

Furthermore, in the above embodiment, the first MOS field effect transistors $Q_{1S0}, \ldots, Q_{1SX}$ and the second MOS field effect transistor $Q_{2S}$ are turned on before and after the read and write operations of the selected nonvolatile memory cell $MC_0$ in the memory block $MB_0$. However, the first MOS field effect transistors $Q_{1S0}, \ldots, Q_{1SX}$ and the second MOS field effect transistor $Q_{2S}$ may be turned on after finishing at least one of the read, write and erase operations of the selected nonvolatile memory cell $MC_0$ in the memory block $MB_0, \ldots, MB_X$.

Furthermore, in a non-access state of the device, the first MOS field effect transistor $Q_{1S0}, \ldots, Q_{1SX}$ and the second MOS field effect transistor $Q_{2S}$ may be turned on to extract a charge accumulated in the drain region of the nonvolatile memory cell $MC_0, \ldots MC_n$.

Furthermore, the above has merely described a case where the present invention is applied to a flash memory technology, which is a field of the background of the present invention, but the present invention is not limited to this case, and, can be applied to other semiconductor integrated circuit device technology, such as a device in which EEPROM cells and a logic circuit are provided on the same semiconductor substrate. The present invention can be applied at least to a semiconductor integrated circuit device having the memory cell region M with the above-described configuration.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit device comprising:
   a plurality of memory blocks, each memory block including:
   a plurality of nonvolatile memory cells arranged in a matrix form, each of the nonvolatile memory cells having a gate region, a source region and a drain region, the memory blocks being arranged in a column direction of the matrix form;
   word lines, each of which is commonly connected to the gate regions of the nonvolatile memory cells in a corresponding row of the matrix form;
   a source line commonly connected to the source regions of the nonvolatile memory cells of the corresponding memory block;
   sub bit lines, each of which is commonly connected to the drain regions of the nonvolatile memory cells in a corresponding column of the matrix form; and
   first switching elements for selecting the corresponding sub bit lines;
   main bit lines common to the memory blocks, the sub bit lines in each of the memory blocks being connected to the corresponding main bit lines via the corresponding first switching elements; and
   at least one second switching element for extracting charges accumulated in drain regions of the nonvolatile memory cells via the first switching elements and the main bit lines, wherein the main bit lines are grounded via the at least one second switching element.

2. The semiconductor integrated circuit device of claim 1, wherein each of the memory cells comprises a floating gate type field effect transistor.

3. The semiconductor integrated circuit device of claim 1, wherein the first switching elements in one of the memory blocks are connected to a common signal line.

4. The semiconductor integrated circuit device of claim 1, wherein each of the first switching elements comprises a MOS field effect transistor, the sub bit lines being connected to the corresponding main bit lines through the corresponding MOS field effect transistors, and the gates of the MOS field effect transistors in one of the memory blocks are commonly connected to a memory block selecting gate line.

5. The semiconductor integrated circuit device of claim 1, wherein one second switching element is provided for each main bit line.

6. A method of controlling a semiconductor integrated circuit device, comprising:
providing a semiconductor integrated circuit device comprising:
a plurality of memory blocks, each memory block including:
a plurality of nonvolatile memory cells arranged in a matrix form, each of the nonvolatile memory cells having a gate region, a source region and a drain region, the memory blocks being arranged in a column direction of the matrix form;
word lines, each of which is commonly connected to the gate regions of the nonvolatile memory cells in a corresponding row of the matrix form;
a source line commonly connected to the source regions of the nonvolatile memory cells of the corresponding memory block;
sub bit lines, each of which is commonly connected to the drain regions of the nonvolatile memory cells in a corresponding column of the matrix form; and
first switching elements for selecting the corresponding sub bit lines;
main bit lines common to the memory blocks, the sub bit lines in each of the memory blocks being connected to the corresponding main bit lines via the corresponding first switching elements; and
at least one second switching element for extracting charges accumulated in drain regions of the nonvolatile memory cells via the first switching elements and the main bit lines; and
turning on the first switching elements and the at least one second switching element upon completion of at least one of read, write and erase operations of a selected one of the nonvolatile memory cells in the memory blocks.

7. A method of controlling a semiconductor integrated circuit device, comprising:
providing a semiconductor integrated circuit device comprising:
a plurality of memory blocks, each memory block including:
a plurality of nonvolatile memory cells arranged in a matrix form, each of the nonvolatile memory cells having a gate region, a source region and a drain region, the memory blocks being arranged in a column direction of the matrix form;
word lines, each of which is commonly connected to the gate regions of the nonvolatile memory cells in a corresponding row of the matrix form;
a source line commonly connected to the source regions of the nonvolatile memory cells of the corresponding memory block;
sub bit lines, each of which is commonly connected to the drain regions of the nonvolatile memory cells in a corresponding column of the matrix form; and
first switching elements for selecting the corresponding sub bit lines;
main bit lines common to the memory blocks, the sub bit lines in each of the memory blocks being connected to the corresponding main bit lines via the corresponding first switching elements; and
at least one second switching element for extracting charges accumulated in drain regions of the nonvolatile memory cells via the first switching elements and the main bit lines; and
turning on the first switching elements upon completion of each of read, write and erase operations of a selected one of the nonvolatile memory cells in the memory blocks.

8. A method of controlling a semiconductor integrated circuit device, comprising:
providing a semiconductor integrated circuit device comprising:
a plurality of memory blocks, each memory block including:
a plurality of nonvolatile memory cells arranged in a matrix form, each of the nonvolatile memory cells having a gate region, a source region and a drain region, the memory blocks being arranged in a column direction of the matrix form;
word lines, each of which is commonly connected to the gate regions of the nonvolatile memory cells in a corresponding row of the matrix form;
a source line commonly connected to the source regions of the nonvolatile memory cells of the corresponding memory block;
sub bit lines, each of which is commonly connected to the drain regions of the nonvolatile memory cells in a corresponding column of the matrix form; and
first switching elements for selecting the corresponding sub bit lines;
main bit lines common to the memory blocks, the sub bit lines in each of the memory blocks being connected to the corresponding main bit lines via the corresponding first switching elements; and
at least one second switching element for extracting charges accumulated in drain regions of the nonvolatile memory cells via the first switching elements and the main bit lines,
turning on the first switching elements and the at least one second switching element in a standby state of the device to thereby extract the charges accumulated in the drain regions of the nonvolatile memory cells.

* * * * *